United States Patent
Wang et al.

(10) Patent No.: US 12,521,836 B2
(45) Date of Patent: *Jan. 13, 2026

(54) SYSTEM AND METHOD FOR MONITORING CHEMICAL MECHANICAL POLISHING

(71) Applicant: TAIWAN SEMICONDUCTOR MANUFACTURING COMPANY, LTD., Hsinchu (TW)

(72) Inventors: Chih-Yu Wang, Taichung (TW); Tien-Wen Wang, Hsinchu (TW); In-Tsang Lin, Kaohsiung (TW); Hsin-Hui Chou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 431 days.

This patent is subject to a terminal disclaimer.

(21) Appl. No.: 18/103,321

(22) Filed: Jan. 30, 2023

(65) Prior Publication Data
US 2023/0182257 A1    Jun. 15, 2023

Related U.S. Application Data

(63) Continuation of application No. 16/175,778, filed on Oct. 30, 2018, now Pat. No. 11,565,365.
(Continued)

(51) Int. Cl.
*B24B 37/005* (2012.01)
*B24B 37/013* (2012.01)
(Continued)

(52) U.S. Cl.
CPC ........ *B24B 37/0053* (2013.01); *B24B 37/013* (2013.01); *B24B 37/105* (2013.01);
(Continued)

(58) Field of Classification Search
None
See application file for complete search history.

(56) References Cited

U.S. PATENT DOCUMENTS 5,222,329 A * 6/1993 Yu ..................... B24B 49/003
                                                451/10
5,240,552 A * 8/1993 Yu ..................... B24B 37/04
                                                438/959

(Continued)

*Primary Examiner* — Sylvia MacArthur
(74) *Attorney, Agent, or Firm* — STUDEBAKER BRACKETT PLLC (57) ABSTRACT

An apparatus for chemical mechanical polishing of a wafer includes a process chamber and a rotatable platen disposed inside the process chamber. A polishing pad is disposed on the platen and a wafer carrier is disposed on the platen. A slurry supply port is configured to supply slurry on the platen. A process controller is configured to control operation of the apparatus. A set of microphones is disposed inside the process chamber. The set of microphones is arranged to detect sound in the process chamber during operation of the apparatus and transmit an electrical signal corresponding to the detected sound. A signal processor is configured to receive the electrical signal from the set of microphones, process the electrical signal to enable detection of an event during operation of the apparatus, and in response to detecting the event, transmit a feedback signal to the process controller. The process controller is further configured to receive the feedback signal and initiate an action based on the received feedback signal.

20 Claims, 6 Drawing Sheets

Related U.S. Application Data (60) Provisional application No. 62/585,182, filed on Nov. 13, 2017.

(51) Int. Cl.
*B24B 37/10* (2012.01)
*B24B 49/00* (2012.01)
*B24B 57/02* (2006.01)
*H01L 21/306* (2006.01)
*H01L 21/66* (2006.01)
*H01L 21/67* (2006.01)

(52) U.S. Cl.
CPC ............ *B24B 49/003* (2013.01); *B24B 57/02* (2013.01); *H01L 21/30625* (2013.01); *H01L 21/67092* (2013.01); *H01L 22/10* (2013.01); *H01L 22/26* (2013.01); *H01L 21/67288* (2013.01)

(56) References Cited

U.S. PATENT DOCUMENTS

| | | | |
|---|---|---|---|
| 5,439,551 A * | 8/1995 | Meikle | B24B 37/042 |
| | | | 438/692 |
| 6,352,466 B1 * | 3/2002 | Moore | B24B 49/00 |
| | | | 451/6 |
| 6,910,942 B1 * | 6/2005 | Dornfeld | B24B 53/017 |
| | | | 451/5 |
| 11,565,365 B2 * | 1/2023 | Wang | H01L 22/26 |
| 2011/0035043 A1 * | 2/2011 | Liu | H01L 21/67253 |
| | | | 700/121 |
| 2013/0182257 A1 * | 7/2013 | Sugimoto | G01N 21/55 |
| | | | 356/445 |
| 2015/0235881 A1 * | 8/2015 | Adderly | G01S 15/42 |
| | | | 29/407.01 |
| 2019/0148191 A1 * | 5/2019 | Wang | B24B 49/10 |
| | | | 438/10 |
| 2020/0039019 A1 * | 2/2020 | Hwang | H01L 21/31053 |
| 2021/0193166 A1 * | 6/2021 | Wang | H01L 21/67017 |
| 2023/0151494 A1 * | 5/2023 | Tseng | H01J 37/32862 |
| | | | 216/69 |

\* cited by examiner

SYSTEM AND METHOD FOR MONITORING CHEMICAL MECHANICAL POLISHING

CROSS-REFERENCE TO RELATED APPLICATIONS

This non-provisional application is a continuation of U.S. patent application Ser. No. 16/175,778, filed Oct. 30, 2018, now U.S. Pat. No. 11,565,365, which claims priority of U.S. Provisional Patent Application No. 62/585,182 filed on Nov. 13, 2017, the entire contents of both these applications are incorporated herein by reference.

TECHNICAL FIELD

This disclosure relates to chemical mechanical polishing methods used in semiconductor manufacturing processes, and an apparatus for chemical mechanical polishing.

BACKGROUND

Size of critical features in an integrated circuit (IC) has continually decreased, and the need to perform high resolution lithography processes grows. As a consequence, the depth of focus of the radiation used for lithography has also decreased. There is a need to control the precision of planarization of wafers at atomic scale. For example, typical depth-of-field requirements for 28 nm, 22 nm, 16 nm and 10 nm technology are approaching angstrom levels. These are, of course, merely examples are not intended to be limiting.

While CMP is most commonly used during wafer fabrication to provide an atomically flat surface at the beginning of the lithography process, as lithography has evolved and complexity of lithography increased, other areas of use for CMP have developed. For example, lately, CMP is used to planarize shallow trenches by polishing metal layers such as aluminum, copper and tungsten, etc.

Despite the increase in versatility of CMP, the traditional issues with CMP remain. For example, CMP can introduce mechanical defects in wafers because of the use of mechanical force while polishing. The polishing pads can create and/or release coarse particles which can cause a scratch on a wafer being polished. Additionally, for many types of surfaces the CMP process requires a "blind" endpoint detection. For example, monitoring of the CMP process has required periodic optical observation of the wafer during the CMP process. This results in substantial down-time for the process, and also has the potential to reduce yield if defects go undetected under manual observation. Improved techniques for online monitoring and control of CMP are, therefore, desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure generally relates to methods and apparatuses for monitoring and controlling a chemical mechanical polishing (CMP) process used in semiconductor manufacturing. More particularly, the methods and apparatuses described herein facilitate monitoring a CMP process for anomalous behavior. Wafers are typically planarized using the CMP process which uses a polishing pad and a chemical slurry. The slurry is typically a colloid of a material that acts as a chemical etchant for etching the material at the top surface of the wafer. The polishing pad is rotated relative to the wafer while slurry is disposed so as to remove material and smooth any irregular topography. The CMP apparatus is not amenable to direct optical inspection during the process. Monitoring of the CMP process is, therefore, performed by periodically stopping the process and inspecting the wafer, to determine whether an endpoint has been reached. Additionally, any anomalous outcome, e.g., a micro-scratch on the wafer surface, is only detected after stopping the process and inspecting the wafer which may be too late to take corrective action. This results in a substantial bottleneck in the overall semiconductor manufacturing process, and affects the manufacturing yield. Embodiments of the apparatuses and methods described herein are expected to facilitate monitoring and control of the CMP process during operation without stopping the process, thereby increasing the speed and yield of the CMP process.

Figure 1:
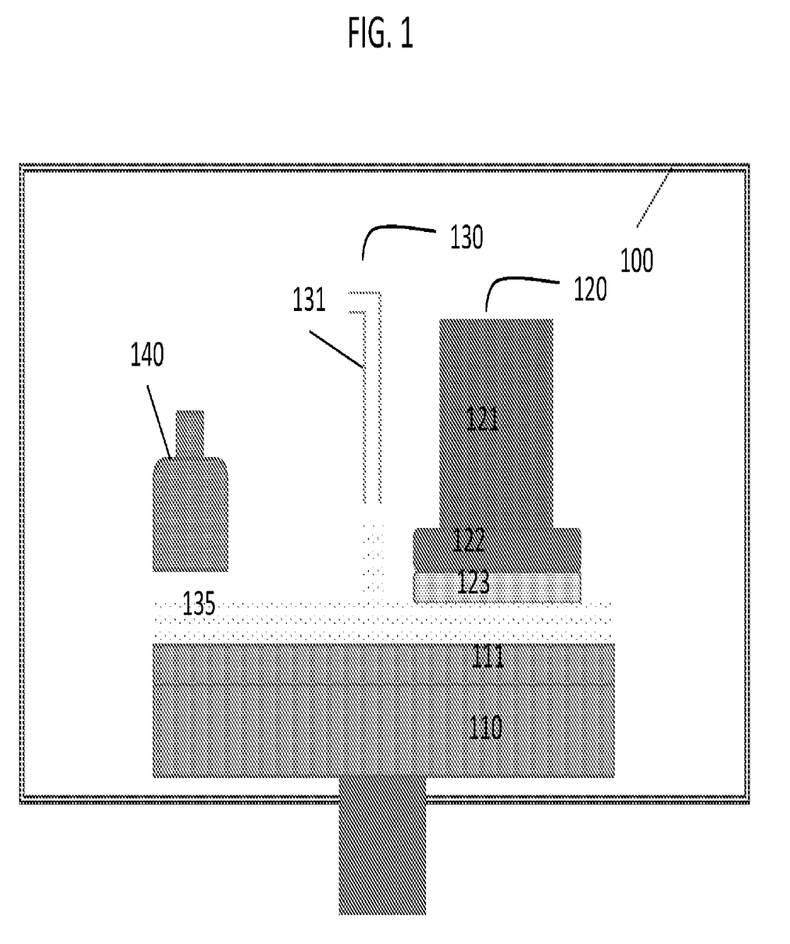
FIG. 1 is a schematic view of an apparatus for chemical mechanical polishing (CMP), in accordance with an embodiment.

FIG. 1 schematically illustrates an apparatus for performing chemical mechanical polishing on a semiconductor wafer, in accordance with an embodiment of the present disclosure. In an embodiment, the apparatus includes a chamber 100 enclosing a rotatable platen 110, a polishing head assembly 120, a chemical slurry supply system 130, and a pad conditioner 140.

In an embodiment, the platen 110 is connected to a motor (not shown) which rotates the platen 110 at a preselected rotational velocity. In an embodiment, the platen 110 is covered with a replaceable polishing pad 111 (interchangeably referred to herein as "the pad") of a relatively soft material. In some embodiments, the pad 111 is a thin polymeric disc with a grooved surface, and can be porous or solid, depending on the application. Factors determining the material and physical properties of the pad 111 include the material to be polished (i.e., material at the wafer surface), and the desired roughness after polishing. The pad 111 may have a pressure sensitive adhesive on the back so that the pad 111 adheres to the platen 110. During the polishing process, the pad may be wetted with a suitable lubricant material, depending on the type of material being polished (i.e., the material at the top surface of the wafer).

In an embodiment, the polishing head assembly 120 includes a head 121 and a carrier 122. The head 121 holds the carrier 122 which in turn holds a wafer 123 to be polished. In some embodiments, the assembly 120 includes a displacement mechanism (not shown) to oscillate the head 120 sideways (with reference to FIG. 1). In some embodiments, the head 121 may include a motor for rotating the wafer 123 relative to the platen 110. In some embodiments, the wafer 123 and the platen 110 are rotated in an asynchronous non-concentric pattern to provide a non-uniform relative motion between the platen 110 and the wafer 123. The non-uniformity of the relative motion facilitates uniform removal of material from the wafer surface by avoiding repeated removal from the same spot. The assembly 120 applies a controlled downward pressure to the wafer 123 to hold the wafer 123 against the platen 110.

The slurry supply system 130 introduces a chemical slurry 135 (interchangeably referred to herein as "the slurry") of a suitable material to be used as an abrasive medium between the pad 111 and the wafer 123. In an embodiment, the slurry 135 is a colloid of abrasive particles dispersed in water with other chemicals such as rust inhibitors and bases to provide an alkaline pH. In some embodiments, the abrasive particles are of materials such as, for example, silica, ceria, and alumina. In an embodiment, the abrasive particles have a generally uniform shape and a narrow size distribution, with average particle size ranging from about 10 nm to about 100 nm or more depending on the application for which it is being used. In an embodiment, the slurry supply system 130 includes a storage system (not explicitly shown) and a conduit 131 for delivering the slurry 135 to the polishing pad 111 atop the platen 110. The rate of flow of the slurry 135 may be controlled based on the application.

In an embodiment, the pad conditioner 140 periodically "conditions" the polishing pad 111 to provide uniform thickness and roughness across the entire area of the platen 110 by polishing the pad 111. Maintaining the thickness and roughness of the pad 111 prevents unwanted pressure points or warpage on the wafer 123 during the polishing process, and helps to maintain uniform thickness of the wafer 123.

Figure 2A:
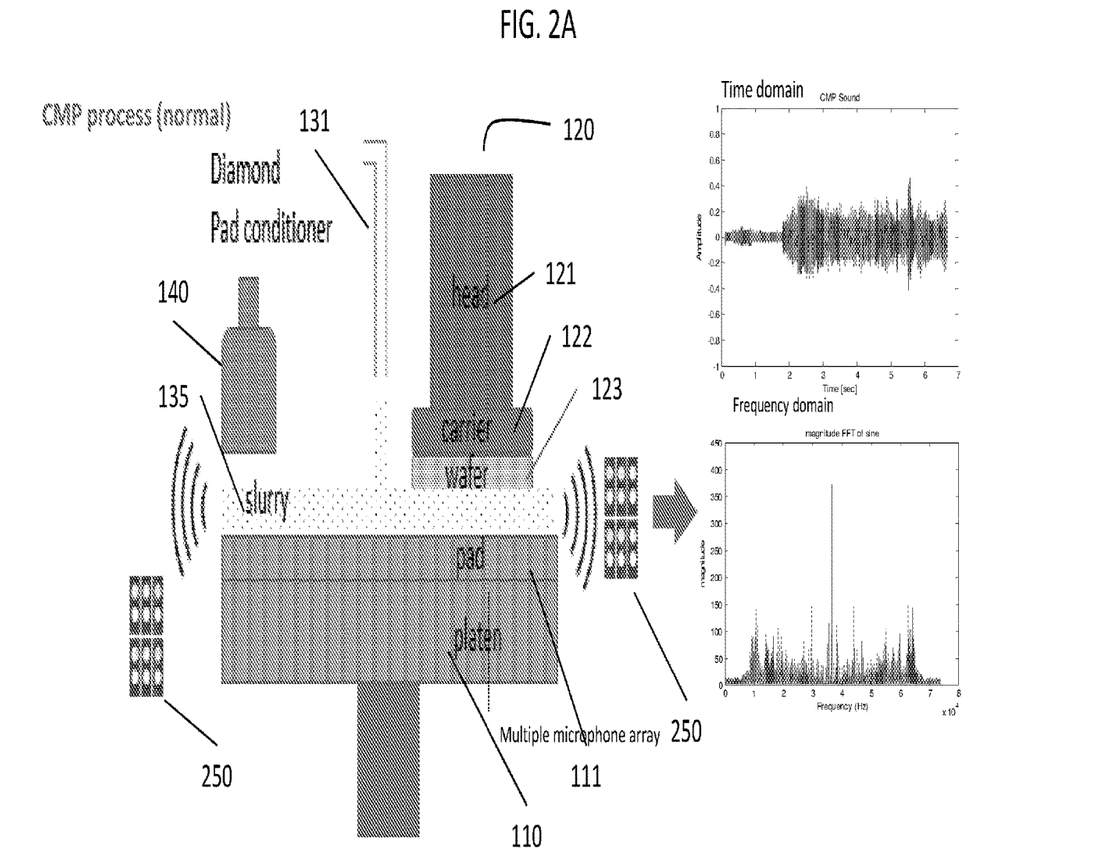
FIG. 2A is a schematic view of CMP process in normal operation and simulated time and frequency domain plots of sound emanating from the process, in accordance with an embodiment.

The substantial mechanical movement of the platen 110 and the polishing head assembly 120 produces characteristic sounds within the chamber 100. FIG. 2A schematically illustrates a normally operating CMP process, and the characteristic sounds, detected by a set of microphones 250, of the normally operating CMP process in time domain and in frequency domain. The amplitude and frequency of sound inside the chamber 100 may depend on factors such as, for example, rotational speed of the platen 110, rotational speed of the wafer 123, oscillation frequency of the head 121, alignment between the platen 110 and the wafer 123, material at the wafer surface, thickness of a film at the wafer surface, material immediately underneath a film at the wafer surface, material of the wafer 123, thickness of the wafer 123, composition of the slurry 135, rate of flow of the slurry 135, material of the polishing pad 111, and condition of the polishing pad 111, etc. Other factors determining the amplitude and frequency of sound inside the chamber 100 are contemplated within the scope of the present disclosure. Although not seen in the figures, in some embodiments the sound spectrum includes sounds of frequencies as low as fractions of a hertz (e.g., 0.01 Hz) to frequencies as high as several megahertz (e.g., 200 MHz).

In some embodiments, if the parameters of the CMP process remain the same, the sound spectrum of a CMP process remains generally the same. On the other hand, as the parameters change the sound spectrum should change. For example, a change in material at the wafer surface because of removal of a film at the top surface of the wafer changes the sound spectrum depending on the material immediately underneath the film at the top surface of the wafer in some embodiments. Other changes and anomalies in the CMP process may also result in a change in the characteristic sound spectrum associated with the CMP process. For example, a scratch on the wafer surface may result in a temporary change in composition of the slurry by temporarily adding particles of the material of the wafer surface to the slurry. These particles may get washed away as more slurry is added to the process and the process continues to operate. However, the temporary change in composition of the slurry may be sufficient to temporarily change the sound spectrum associated with the CMP process.

Figure 2B:
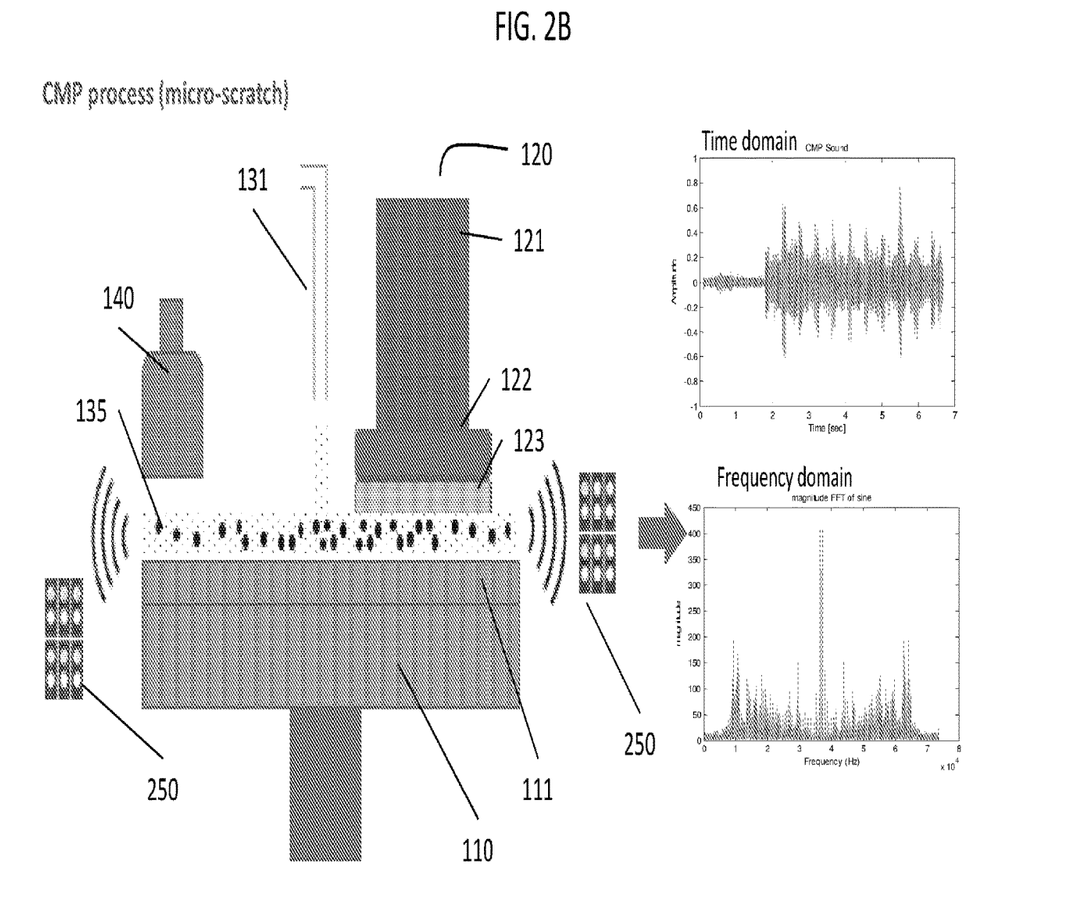
FIG. 2B is a schematic view of CMP process in abnormal operation and simulated time and frequency domain plots of sound emanating from the process, in accordance with an embodiment.
Figure 2C:
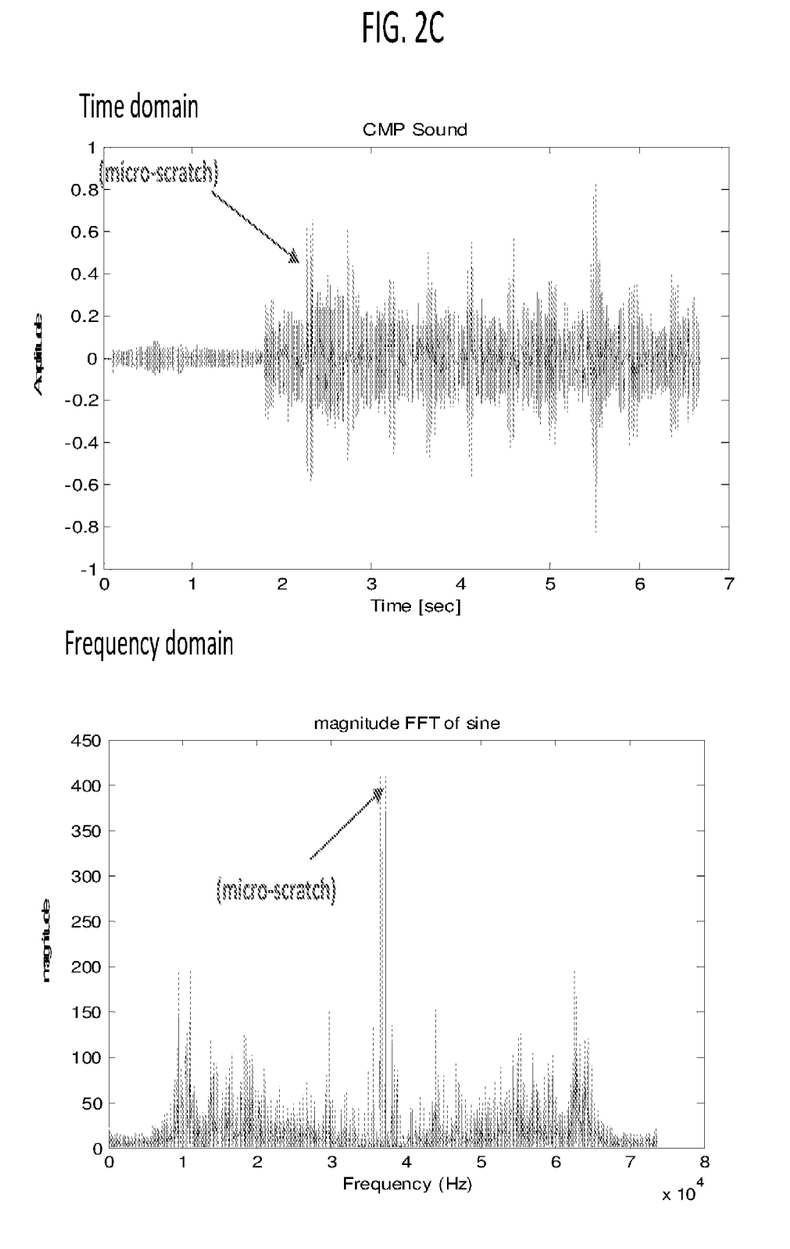
FIG. 2C illustrates an overlay of the time and frequency domain plots of sound emanating from a normal CMP process and an abnormal CMP process, in accordance with an embodiment.

FIG. 2B schematically illustrates an anomalously operating CMP process, and the characteristic sounds, detected by a set of microphones 250, in time domain and frequency domain. FIG. 2C depicts a sound spectrum of the anomalously operating CMP process from FIG. 2B overlaid on the sound spectrum of the normally operating CMP process from FIG. 2A.

Specifically, FIG. 2B depicts a change in composition of the slurry 123 because of an occurrence of a micro-scratch on the wafer surface. The additional particles from the wafer surface and a localized change in thickness of the top layer of the wafer surface results in a sound spectrum that is different from the sound spectrum of the normally proceeding CMP shown in FIG. 2A. As can be seen in FIG. 2C, some parts of the sound spectrum of the CMP process remain unchanged, while other parts of the sound spectrum of the CMP process undergo substantial change because of the micro-scratch.

Changes in sound spectrum, thus, indicates a change in parameters of the CMP process in some embodiments. In some cases, the change occurs as the process continues to operate. For example, a change in sound spectrum occurs because of a change in thickness of the top layer of the wafer. However, certain changes, such as the one depicted in FIG. 2B because of the micro-scratch, may not be expected in a normal CMP process. The occurrence of a desired event or an anomalous event in a CMP process may be detected by continuously analyzing the sound spectrum to detect patterns in the sound spectrum during the CMP process and comparing the detected patterns with known or learned patterns of sound spectrum. Anomalous events include, without limitation, a micro-scratch on the wafer surface from slurry abrasive; abnormal positioning or thickness of the polishing pad; abnormal leveling of the polishing pad; the platen or the wafer; degradation of the polishing pad, etc.

Figure 3:
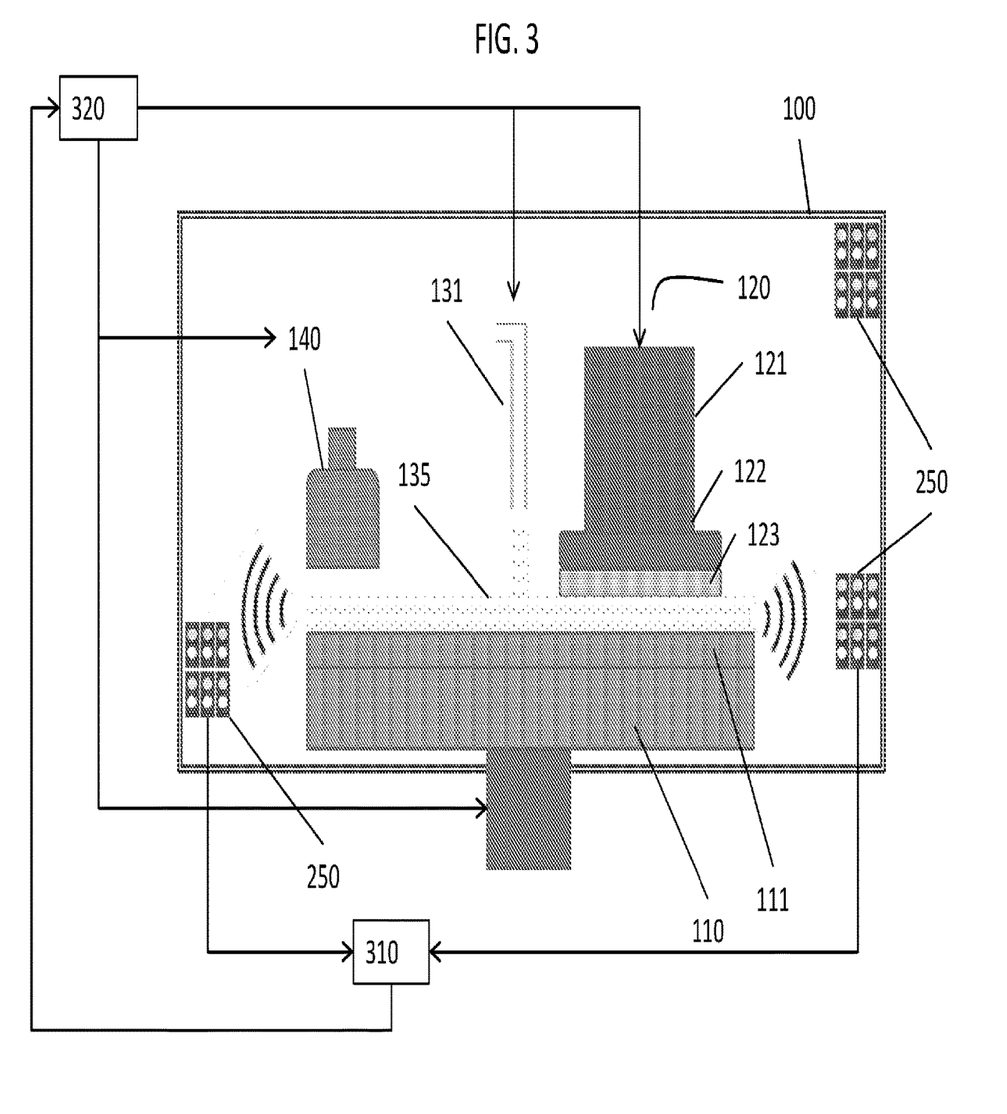
FIG. 3 is a schematic view of an apparatus for monitoring a CMP process, in accordance with an embodiment.

FIG. 3 schematically illustrates an apparatus for monitoring a CMP process, in accordance with an embodiment of the present disclosure. In an embodiment, the apparatus for monitoring the CMP process includes a set of microphones 250 disposed in or adjacent to the chamber for the CMP apparatus depicted in FIG. 1. The apparatus for monitoring the CMP process further includes a signal processor 310 operatively connected to the set of microphones 250 and configured to receive and process an electrical signal from the set of microphones 250. The apparatus further includes a process controller 320 operatively connected to the signal processor 310 and configured to receive a feedback signal from the signal processor 310 and control parameters of the CMP process based on the feedback signal.

In an embodiment, the set of microphones 250 includes one or more microphones chosen to optimize the sound collected from the CMP process. For example, the set of microphones 250 may include a single wide-band microphone designed to detect sound in the range of about 0.01 Hz to about 200 MHz. In some embodiments, the set of microphones 250 includes several narrow-band microphones tailored to detect specific frequency ranges. For example, the set of microphones 250 may include one or more infrasonic microphones designed to detect sounds of frequencies from about 0.01 Hz to about 20 Hz, one or more acoustic microphones designed to detect sounds of frequencies from about 20 Hz to about 20 kHz and one or more ultrasonic microphones designed to detect sounds from about 20 kHz to about 200 MHz. An example of infrasonic microphones includes, but is not limited to, an electret condenser microphone. Examples of acoustic and ultrasonic microphones include, but are not limited to, piezoelectric microphones, capacitive microphones, moving coil microphones, or optoacoustic microphones.

In an embodiment, the set of microphones 250 is disposed at a location within or adjacent to the chamber 100 to maximize the detected sound. In an embodiment, the set of microphones 250 is disposed on or adjacent to a wall of the chamber 100. In some embodiments, the set of microphones 250 is distributed throughout the chamber 100. For example, some of the microphones in the set of microphones 250 may be placed on the chamber wall 100, while others may be placed underneath the platen 110 and yet others may be placed on the top-side of the carrier 122 away from the wafer 123. In some embodiments, the distribution and placement of the microphones is optimized based on the frequency and amplitude of sound anticipated at a particular location within the chamber 100. It is expected that higher frequency sounds are directional and attenuate in a radial direction. For such sounds, narrow-band microphones designed to detect directional sounds are used in certain embodiments. In other embodiments, the set of microphones 250 are placed outside the chamber 100 at locations where sound from the chamber 100 can be detected.

Referring to FIG. 3, in an embodiment, an infrasonic microphone is disposed on or adjacent to a top wall of the chamber 100, a set of narrow-band acoustic microphones collectively spanning the entire acoustic spectrum (i.e., about 20 Hz to about 20 kHz) is disposed on or adjacent to sidewalls of the chamber 100, a set of narrow-band ultrasonic microphones collectively spanning a sound spectrum ranging from about 20 kHz to about 200 MHz is disposed on a bottom-side (not explicitly shown) of the platen 110 (away from the pad 111), and a set of narrow-band ultrasonic microphones collectively spanning a sound spectrum ranging from about 20 kHz to about 200 MHz is disposed on a top-side (not explicitly shown) of the carrier 122 (away from wafer 123).

In an embodiment, each of the microphones in the set of microphones 250 is hard-wired to the signal processor 310 so as to transmit electrical signals corresponding to the sound it detects. In another embodiment, each of the microphones in the set of microphones 250 transmits the electrical signals corresponding to the sound it detects wirelessly to the signal processor 310. For example, the microphones transmit the electrical signals to the signal processor 310 using a wireless communication protocol such as Bluetooth, or IEEE 802.11 (Wi-Fi) in certain embodiments. Other types of wireless communication protocols, including proprietary protocols, are contemplated within the scope of the present disclosure.

In an embodiment, the signal processor 310 includes a non-transitory computer-readable memory and a processor configured to receive the electrical signals from the set of microphones 250, process the electrical signals and analyze the electrical signals. Signal processing includes, without limitation, synchronizing the electrical signals and filtering the electrical signals to reduce noise.

In some embodiments, the set of microphones 250 is spatially dispersed within or adjacent to the chamber 100 and unsynchronized to facilitate installation of the microphones. In such embodiments, synchronization of the electrical signals received from the various microphones at the signal processor 310 may be performed if necessary. In an embodiment, synchronizing the electrical signals includes generating a timing signal having a frequency substantially disjoint from the frequencies of the unsynchronized electrical signals, transmitting the timing signal to each of the microphones, receiving a combined signal including a combination of the timing signal and a corresponding unsynchronized electrical signal from each of the microphones, and separating each of the combined signals to recover the unsynchronized electrical signal and the timing signal and aligning the unsynchronized signals according to the recovered timing signal to produce synchronized electrical signals. In such embodiments, it is contemplated that frequency of the timing signal is chosen. Therefore, any overlay in energy with the unsynchronized electrical signals can be negligible to avoid drowning out information contained in the electrical signals. For example, in some embodiments, the timing signal has a frequency in the gigahertz (GHz) region where the electrical signals received from the set of microphones 250 have very little or no energy.

In an embodiment, all of the microphones in the set of microphones 250 are synchronized using a signal from the process controller 320. For example, the process controller transmits an "initiate detection" signal to each of the microphones simultaneously and each of the microphones begins detecting the sound signals in response to receiving the "initiate detection" signal in some embodiments. The process controller 320 synchronizes the "initiate detection" signal with a start of the operation of the CMP process in some embodiments. Thus, sound detection (and thereby generation of electrical signals) at each of the microphones is synchronized with the start of the CMP process. Other methods of synchronizing the electrical signals from the unsynchronized microphones are contemplated within the scope of the present disclosure.

In an embodiment, the signal processor 310 is configured to filter the electrical signals received from each of the set of microphones 250 to reduce ambient sound and noise so as to improve the signal to noise ratio (SNR). Various methods for filtering electrical signals are known in the art and will not be detailed herein.

Signal analysis includes, without limitation, sound source position detection, time domain analysis of the sound spectrum, conversion of the electrical signal from time domain to frequency domain, frequency domain analysis of the sound spectrum, decomposition of the signals, pattern recognition, pattern comparison, etc.

In an embodiment, the signal processor 310 is configured to detect the position of a source of sound. The source of sound may be detected using a triangulation algorithm. For example, in cases where the microphones of the set of microphones 250 are unsynchronized, the set of microphones 250 are composed to have three or more microphones having identical band-width and frequency sensitivities disposed around the chamber 100 in some embodiments. The band-width and central frequency of the three or more microphones are chosen, for example, following a frequency domain analysis of the sound spectrum during the CMP process, to maximize the strength of the sound signals received or detected at the three or more microphones in some embodiments. Following a synchronization process, a time difference in the arrival of the specific sound received at the three or more microphones may then be used to calculate the distance of the source of the sound from each of the three or more microphones, which in turn is used to calculate the location of the source of sound.

In embodiments where the microphones from the set of microphones 250 are synchronized, e.g., through the process controller, the signal processor 310 is configured to receive the synchronized electrical signals, process the signals to detect a common pattern in signals from microphones that detect sounds in an overlapping frequency band and calculate a time difference between the common pattern coming from different microphones. A position of a source of that common pattern is calculated based on the time difference by using the positions of the microphones providing the common pattern.

In various embodiments, algorithms such as, for example, Fourier transform (e.g., FFT, DFT, etc.), Laplace transform, or wavelet transform are employed to convert the time domain signals to frequency domain signals.

Pattern recognition may include a model-based method or a machine-learning method. In an embodiment, a model-based method is used for recognizing patterns in the sound spectrum following synchronization of all electrical signals received from the set of microphones 250. In the model-based method, a model for sound spectrum for a normal CMP process (with a given set of parameters) is generated using regression analysis performed over several normal cycles of the CMP process. For example, the signal processor 310 recognizes a micro-scratch formed on the wafer surface during a CMP process for planarizing a shallow trench based on a model for sound spectra for a CMP process for planarizing a shallow trench by recognizing a deviation from the model sound spectra in some embodiments.

In an embodiment, the signal processor 310 is configured to "learn" normal sound spectra, abnormal sound spectra, and sound patterns associated with a desired normal event by providing feedback to the signal processor 310 about normality or abnormality (and the cause of abnormality) of the process as well as by indicating a specific event in a normal cycle. Examples of specific events include, but are not limited to, reaching an end-point, and reaching a desired thickness of the top film, etc. Patterns of sound spectra may depend on factors such as material of the wafer surface (aluminum, copper, tungsten, silicon dioxide, and silicon nitride, etc.), layout of the surface (device pattern on the top surface, pattern density, etc.) and composition of the slurry.

For example, in some embodiments, the signal processor 310 "learns" that a normal CMP process for planarizing a shallow trench has a particular pattern, viz., normal pattern, and a micro-scratch formed on the wafer surface during a CMP process for planarizing a shallow trench results in the normal pattern changing a particular way based on recognizing patterns of the sound spectra of the CMP process over a large number of process cycles.

In an embodiment, once a pattern for the sound spectra (interchangeably referred to herein as the "sound pattern") is recognized, the signal processor 310 generates a feedback signal including information relating to the CMP process based on the sound pattern, and transmits the feedback signal to the process controller 320. The feedback signal may simply be an "all OK" signal if the sound pattern indicates a normal process. In an embodiment, the feedback signal for a normal process additionally includes indication that a predetermined event such as, for example, an end-point, or a desired thickness, has occurred. On the other hand, if the pattern of sound spectra indicates an abnormal process, the feedback signal indicates to the process controller 320 that an abnormal or anomalous event has occurred. In such cases, the feedback signal includes information about the anomalous event indicating, for example, the type of event and the source of anomaly.

In an embodiment, the process controller 320 includes a non-transitory computer-readable memory and a processor configured to receive the feedback signal from the signal processor, analyze the feedback signal and control various parameters of the CMP process by transmitting commands to various processing units of the CMP apparatus including, but not limited to, the platen 110, the polishing head assembly 120, the slurry supply system 130 and the pad conditioner 140. The parameters of the CMP process that are controlled by the process controller 320, in some embodiments, include, without limitation, rotational velocity of the platen 110, flow rate and composition of the slurry 135 being supplied on the polishing pad 111, pressure at which the wafer 123 contacts the polishing pad 111, conditioning of the polishing pad 111, rotational velocity of the wafer carrier 122, oscillation frequency of the polishing head 121, etc. In an embodiment, the process controller 320 is further configured to communicate with the set of microphones 250 to, for example, facilitate synchronizing the microphones.

In an embodiment, upon receiving a feedback signal that an event (normal or anomalous) has occurred, the process controller 320 analyzes the feedback signal and initiates a predetermined action in response to the occurrence of event. In case of a normal, desired event such as an end-point of the CMP process or a change in material, the process controller 320 initiates action to stop the process. In an embodiment, the feedback signal includes information that the material removal rate is lower than normal. A low removal rate may occur because of a change in material at the surface of the wafer or because the slurry flow rate is not optimized. Thus, if the feedback signal, based on the sound pattern analyzed by the signal processor 310, indicates that the decrease in removal rate has occurred because of a change in material at the wafer surface, and a change in material is the desired outcome of the process, then the process controller 320 determines that the process is continuing normally and no corrective action is needed.

In case of an anomalous event, the process controller 320 determines whether a corrective action will normalize the process following the anomalous event and determines which of the process parameters is best suited for normalizing the process based on the feedback signal in some embodiments. For example, if the feedback signal indicates that the decrease in removal rate has occurred because of non-optimal slurry flow rate, the process controller 320 transmits a command to the slurry supply system 130 to change the slurry flow rate.

Figure 4:
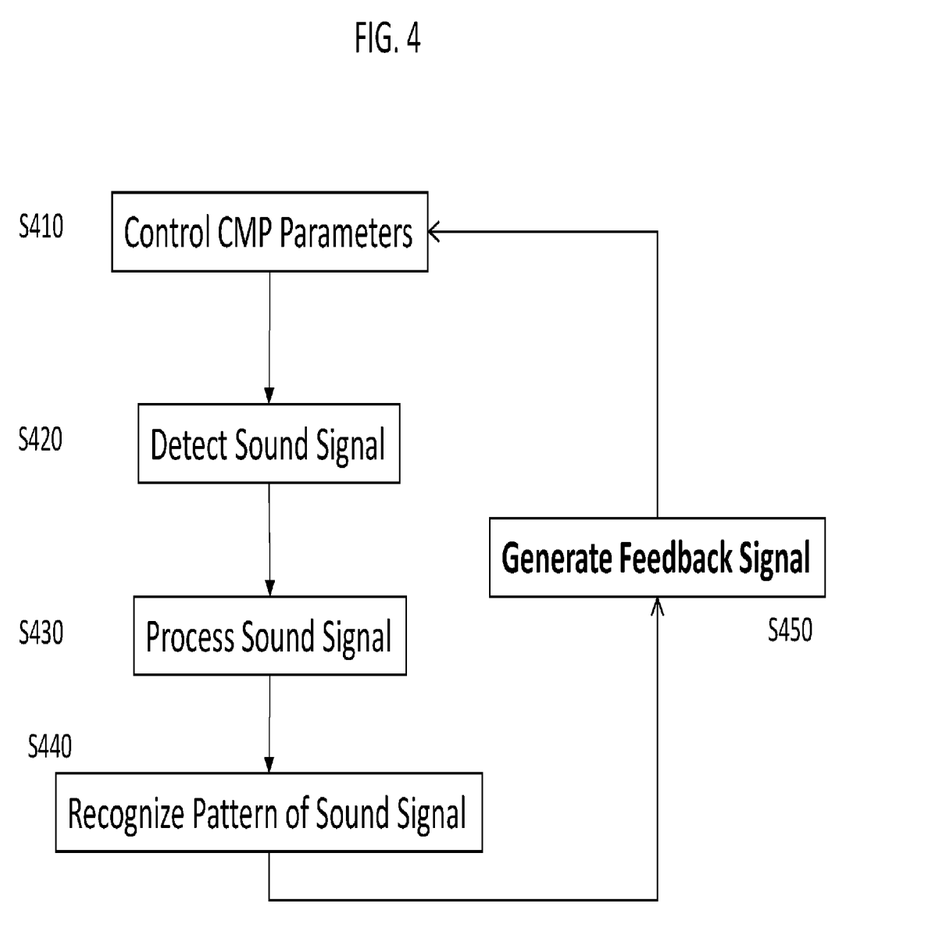
FIG. 4 depicts an illustrative flow chart for a method of monitoring a CMP process, in accordance with an embodiment.

FIG. 4 depicts a flow chart for a method of monitoring a CMP process. In an embodiment, the method for monitoring a CMP process includes, at S420, detecting a sound signal generated during a CMP process; at S430, processing the sound signal; at S440, recognizing patterns of the sound signal to detect an occurrence of a predetermined event; at S450 generating a feedback signal including information associated with the predetermined event; and at S410 controlling parameters of the CMP process based on the information in the feedback signal.

Detecting the sound signal is performed using a set of microphones disposed in the chamber enclosing the CMP apparatus in some embodiments. The set of microphones includes one or more microphones chosen to maximize the sound collected from the CMP process. For example, a single wide-band microphone designed to detect sound in the range of about 0.01 Hz to about 200 MHz is disposed at a suitable location in the CMP process chamber. Alternatively, or in addition, several narrow-band microphones tailored to detect specific frequency ranges are employed. In an embodiment, the set of microphones is disposed at a location within the chamber to maximize the detected sound. For example, the microphones are disposed on the chamber wall, the bottom-side of the platen and/or the top-side of the wafer carrier.

The detected sound signal is converted into an electrical signal and transmitted to a signal processor for processing the electrical signals corresponding to the sound detected by the set of microphones. The term "sound signals" is interchangeably used herein to indicate the electrical signals corresponding to the sound detected by the set of microphones. In an embodiment, the signal processor includes a non-transitory computer-readable memory and a processor configured to receive the sound signals, process the sound signals and analyze the sound signals. Processing the sound signals may include, without limitation, receiving the sound signals, synchronizing the received signals, and filtering the synchronized signals to reduce noise.

In some embodiments, synchronization of the received signals is achieved by generating a timing signal having a frequency substantially disjoint from the frequencies of the unsynchronized electrical signals, transmitting the timing signal to each of the microphones, receiving a combined signal including a combination of the timing signal and a corresponding unsynchronized electrical signal from each of the microphones, and separating each of the combined signals to recover the unsynchronized electrical signal and the timing signal and aligning the unsynchronized signals according to the recovered timing signal to produce synchronized electrical signals. In such embodiments, it is contemplated that frequency of the timing signal is chosen such that there is negligible, if any, overlap in energy with the unsynchronized electrical signals so as to avoid drowning out information contained in the electrical signals.

In some embodiments, the microphones are synchronized using a synchronization signal from a process controller configured to control various process parameters of the CMP process. For example, the process controller transmits a synchronization signal indicating a start-time of the CMP process, thereby commanding the set of microphones to initiate sound detection.

Analyzing includes, without limitation, detecting of sound source position, analyzing the sound spectrum in time domain, converting the electrical signal from time domain to frequency domain, analyzing the sound spectrum in frequency domain, decomposing the signals, recognizing patterns in the signal and comparing the recognized patterns with known or learned patterns, etc.

The source of sound may be detected using a triangulation algorithm. In an embodiment, band-width and central frequency of the three or more microphones is chosen, following a frequency domain analysis of the sound spectrum during the CMP process, to maximize the strength of the sound signals received or detected at the three or more microphones. Following a synchronization process, a time difference in the arrival of the specific sound received at the three or more microphones may then be used to calculate the distance of the source of the sound from each of the three or more microphones, which may in turn be used to calculate the location of the source of sound. Other methods for detecting a source of sound using unsynchronized spatially dispersed microphones are contemplated within the scope of the present disclosure.

Recognizing the patterns of sound signals may be achieved either by a model-based method or a machine-learning method. In an embodiment, a model for sound spectrum for a normal CMP process (with a given set of parameters) is generated using regression analysis performed over several normal cycles of the CMP process. In such embodiments, a predetermined normal event is recognized based on the model, and an abnormal event is recognized by recognizing a deviation from the model sound spectra.

In an embodiment, normal sound spectra abnormal sound spectra, and sound patterns associated with a desired normal event are learned based on a feedback relating to the normality, abnormality (and the cause of abnormality) and indications relating to the desired normal event. In such embodiments, events are recognized based on comparison with the "learned" patterns.

Once a pattern is recognized, the information associated with the recognized pattern is used to generate a feedback signal which includes information relating to the event (normal or abnormal) corresponding to the recognized pattern. In cases where the detected event is a desired event, e.g., an end-point, a desired change in thickness, or a desired change in material, the information from the feedback signal may be used to terminate the process, or change certain parameters of the process to enable the process to continue normally as desired. In cases where the detected event is abnormal or anomalous, the information from the feedback signal is used to control the parameters for the CMP process to either terminate the CMP process or provide a corrective action that normalizes the CMP process following the abnormal or anomalous event.

The parameters of the CMP process that may be controlled include, without limitation, rotational velocity of the platen, flow rate and composition of the slurry being supplied on the polishing pad, pressure at which the wafer contacts the polishing pad, conditioning of the polishing pad, rotational velocity of the wafer carrier, and oscillation frequency of the polishing head, etc.

It will be understood that not all advantages have been necessarily discussed herein, no particular advantage is required for all embodiments or examples, and other embodiments or examples may offer different advantages.

According to one aspect of the present disclosure, an apparatus for chemical mechanical polishing of a wafer includes a process chamber, a rotatable platen disposed substantially horizontally inside of the process chamber, a polishing pad disposed on the platen, a wafer carrier disposed on the platen, the wafer carrier including a wafer holder configured to retain the wafer, the wafer being held upside down on the pad during operation of the apparatus, a slurry supply port configured to supply slurry on the platen, a process controller configured control operation of the apparatus, a set of microphones disposed in or adjacent to the process chamber, the set of microphones arranged to detect sound in the process chamber during operation of the apparatus and transmit an electrical signal corresponding to the detected sound, and a signal processor configured to receive the electrical signal from the set of microphones, process the electrical signal to enable detection of an event during operation of the apparatus, and in response to detecting the event, transmit a feedback signal to the process controller. The process controller is further configured to receive the feedback signal and initiate an action based on the received feedback signal. In one or more of the foregoing and following embodiments, the set of microphones includes microphones configured to detect sounds with frequency in a range of about 0.01 Hz to about 200 MHz. In an embodiment, the action includes at least one selected from the group consisting of changing a rotational velocity of the rotatable platen, changing a flow rate and composition of the slurry being supplied through the slurry port, and changing a pressure at which the wafer contacts the polishing pad. In an embodiment, the set of microphones is configured to transmit the electrical signal using a wireless communication protocol. In an embodiment, the signal processor is further configured to perform at least one selected from the group consisting of filtering the electrical signal to remove noise or ambient sound from the detected sound, detecting a position of a source of the detected sound, processing the electrical signal in time domain or in frequency domain, and recognizing patterns in the detected sound as corresponding to predetermined events during the operation of the apparatus. In one or more of the foregoing and following embodiments, the recognizing patterns includes matching patterns of sounds with known events based on event models or using previously learned correspondence between patterns of sounds and events.

According to another aspect of the present disclosure, a method of operating an apparatus for chemical mechanical polishing includes detecting sound in a process chamber of the apparatus during operation of the apparatus and transmitting an electrical signal corresponding to the detected sound to a signal processor using a set of microphones, processing, at the signal processor, the electrical signal received from the set of microphones to enable detection of an event during operation of the apparatus, and in response to detecting the event, transmitting a feedback signal corresponding to the detected event to a process controller, and initiating, by the process controller, an action based on the received feedback signal. In one or more of the foregoing and following embodiments, the action includes changing one or more parameters of the chemical mechanical polishing. In one or more of the foregoing and following embodiments, the set of microphones includes microphones configured to detect sounds with a frequency in the range of about 0.01 Hz to about 200 MHz. In an embodiment, the parameters include at least one selected from the group consisting of a rotational velocity of a rotatable platen, a flow rate and composition of a slurry being supplied on an polishing pad disposed on the rotatable platen, and a pressure at which a wafer contacts the polishing pad. In an embodiment, the event is at least one selected from the group consisting of an end point of the chemical mechanical polishing; a scratch on a wafer surface, degradation of an polishing pad, abnormal leveling of the polishing pad or the wafer, presence of an abrasive particle on the polishing pad or the wafer surface, and change in material at the wafer surface. In one or more of the foregoing and following embodiments, the processing the electrical signal includes at least one selected from the group consisting of filtering the electrical signal to remove noise or ambient sound from the detected sound, detecting a position of a source of the detected sound, processing the electrical signal in time domain or in frequency domain, and recognizing patterns in the detected sound as corresponding to predetermined events during the operation of the apparatus. In an embodiment, the recognizing patterns includes matching patterns of sounds with known events based on event models or using previously learned correspondence between patterns of sounds and events. In an embodiment, the set of microphones is configured to transmit the electrical signal using a wireless communication protocol.

According to yet another aspect of the present disclosure, a system for monitoring a chemical mechanical polishing process includes a process controller configured control parameters of the process, a set of microphones disposed in or adjacent to a process chamber of an apparatus for chemical mechanical polishing, the set of microphones arranged to detect sound in the process chamber during the process and transmit an electrical signal corresponding to the detected sound, and a signal processor configured to receive the electrical signal from the set of microphones, process the electrical signal to enable detection of an event during operation of the apparatus, and in response to detecting the event, transmit a feedback signal corresponding to the detected event to the process controller. In an embodiment, the process controller is further configured to receive the feedback signal and initiate a change in one or more parameters of the process based on the received feedback signal. In one or more of the foregoing and following embodiments, the one or more parameters of the process includes at least one selected from the group consisting of a rotational velocity of a rotatable platen, a flow rate and composition of a slurry being supplied on an polishing pad disposed on the rotatable platen, and a pressure at which a wafer contacts the polishing pad. In an embodiment, the set of microphones includes microphones configured to detect sounds with a frequency in the range of about 0 Hz to about 200 MHz. In an embodiment, the set of microphones is configured to transmit the electrical signal using a wireless communication protocol. In one or more of the foregoing and following embodiments, the signal processor is further configured to perform at least one selected from the group consisting of filtering the electrical signal to remove noise or ambient sound from the detected sound, detecting a position of a source of the detected sound, processing the electrical signal in time domain or in frequency domain, and recognizing patterns in the detected sound as corresponding to predetermined events during the operation of the apparatus. In an embodiment, the recognizing patterns includes matching patterns of sounds with known events based on event models or using previously learned correspondence between patterns of sounds and events.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for chemical mechanical polishing of a wafer, the system comprising:
   a process chamber;
   a rotatable platen disposed substantially horizontally inside of the process chamber;
   a polishing pad disposed on the rotatable platen;
   a wafer carrier disposed on the rotatable platen, the wafer carrier configured to retain the wafer;
   a slurry supply port configured to supply slurry to the rotatable platen;
   a set of microphones including at least one infrasonic microphone disposed on or adjacent to a top wall of the process chamber, at least one acoustic microphone disposed on or adjacent to sidewalls of the process chamber, a first ultrasonic microphone disposed on a bottom-side of the rotatable platen, and a second ultrasonic microphone disposed on a top-side of the wafer carrier, the set of microphones arranged to detect sound in the process chamber during an operation of the system and to transmit an electrical signal corresponding to the detected sound;
   a process controller configured to transmit an initiate signal to each microphone of the set of microphones, the process controller synchronizing the initiate signal with a start of the operation of the system, wherein the set of microphones detect sound in the process chamber upon receipt of the initiate signal, obtain electrical signals corresponding to the detected sounds, and transmit the electrical signals to a signal processor; and
   the signal processor configured to process the electrical signals received from the set of microphones to detect a sound pattern in the electrical signals, generate a feedback signal based on the sound pattern, and transmit the feedback signal to the process controller.

2. The system of claim 1, wherein the process controller is further configured to initiate an action based on the feedback signal received, the action including at least one selected from the group consisting of changing a rotational velocity of the rotatable platen, changing a flow rate and composition of the slurry being supplied through the slurry supply port, and changing a pressure at which the wafer contacts the polishing pad.

3. The system of claim 1, wherein the signal process is further configured to detect an event that occurred during the operation of the system from the sound pattern, wherein the event is at least one selected from the group consisting of an end point of a process, a scratch on wafer surface, degradation of the polishing pad, abnormal leveling of the polishing pad or the wafer, presence of an abrasive particle on the polishing pad or wafer surface, and change in material at wafer surface.

4. The system of claim 1, wherein the signal processor is further configured to perform at least one selected from the group consisting of filtering the electrical signal to remove noise or ambient sound from the detected sound, detecting a position of a source of the detected sound, and processing the electrical signal in a time domain and in a frequency domain.

5. The system of claim 1, wherein the at least one infrasonic microphone is designed to detect sounds of frequencies from about 0.01 Hz to about 20 Hz, the at least one acoustic microphone is designed to detect sounds of frequencies from about 20 Hz to about 20 kHz, and the first and second ultrasonic microphones are each designed to detect sounds from about 20 kHz to about 200 MHz.

6. A method of operating an apparatus for chemical mechanical polishing, the method comprising:
   placing a set of microphones including at least three microphones in or around a process chamber, wherein the set of microphones including at least one infrasonic microphone, at least one acoustic microphone, and at least one ultrasonic microphone, and wherein the at least one infrasonic microphone is disposed on or adjacent to a top wall of the process chamber, the at least one acoustic microphone is disposed on or adjacent to sidewalls of the process chamber, and the at least one ultrasonic microphone includes a first ultrasonic microphone disposed on or adjacent a bottom surface of the process chamber and a second ultrasonic microphone disposed between the top wall and the bottom surface of the process chamber;
   adjusting band-widths and central frequencies of the at least three microphones so that a strength of sound signals received or detected at the microphones are maximized;
   receiving simultaneously, at each of the at least three microphones, an initiate signal from a process controller, the process controller synchronizing the initiate signal with a start of a chemical mechanical polishing operation;
   detecting, using the at least three microphones, sound in the process chamber during the chemical mechanical polishing operation and upon receipt of the initiate signal;
   obtaining electrical signals corresponding to the detected sounds using the at least three microphones;
   transmitting the electrical signals to a signal processor using the set of microphones;
   processing, at the signal processor, the electrical signals received from the set of microphones to detect a sound pattern in the electrical signals received from the set of microphones;
   generating a feedback signal based on the sound pattern; and
   transmitting the feedback signal to a process controller configured to control the operation of the apparatus.

7. The method of claim 6, wherein the feedback signal includes information about an anomalous event that occurred during the chemical mechanical polishing operation, and the method further comprises:
   determining, by the process controller, whether a corrective action will normalize the chemical mechanical polishing operation following the anomalous event and determining a parameter of the chemical mechanical polishing operation suitable for normalizing the chemical mechanical polishing operation based on the feedback signal.

8. The method of claim 7, wherein the parameter comprise at least one selected from the group consisting of a rotational velocity of a rotatable platen in the process chamber, a flow rate and composition of a slurry being used in the chemical mechanical polishing operation, and a pressure at which a wafer contacts a polishing pad disposed on the rotatable platen.

9. The method of claim 6, wherein processing the electrical signals comprises
recognizing patterns in the detected sound as corresponding to predetermined events during the operation of the apparatus and matching patterns of sounds with known events based on event models or using previously learned correspondence between patterns of sounds and events.

10. The method of claim 6, wherein detecting the sound detects an event that occurred during the chemical mechanical polishing operation, the detected event being at least one selected from the group consisting of an end point of the chemical mechanical polishing, a scratch on a wafer surface, degradation of a polishing pad, abnormal leveling of the polishing pad or the wafer, presence of an abrasive particle on the polishing pad or the wafer surface, and change in material at the wafer surface.

11. The method of claim 6, wherein processing the electrical signals comprises at least one selected from the group consisting of filtering the electrical signal to remove noise or ambient sound from the detected sound, detecting a position of a source of the detected sound, and processing the electrical signal in a time domain or in a frequency domain or both.

12. The method of claim 6, wherein electrical signals output from the at least three microphones are indicative of frequency range of sounds detected by the at least three microphones and a frequency range of sounds detected by each microphone of the at least three microphones is different.

13. The method of claim 6, wherein the set of microphones is configured to detect sounds with a frequency in a range of about 0.01 Hz to about 200 MHz.

14. An apparatus for monitoring a chemical mechanical polishing process, the apparatus comprising:
a process controller configured to control parameters of the chemical mechanical polishing process performed in a process chamber, wherein a rotatable platen is disposed inside the process chamber, and a wafer carrier is disposed on the rotatable platen and configured to retain a wafer for polishing;
a set of microphones disposed in or around a process chamber of the apparatus, the set of microphones configured to detect sound in the process chamber during the process and to transmit an electrical signal corresponding to the detected sound, the electrical signals from the set of microphones being unsynchronized with each other,
wherein the set of microphones includes at least one infrasonic microphone disposed on or adjacent to a top wall of the process chamber, at least one acoustic microphone disposed on or adjacent to sidewalls of the process chamber, and at least one ultrasonic microphone disposed on a bottom-side of the rotatable platen; and
a signal processor configured to transmit, to each microphone, a timing signal having a frequency disjoint from the frequencies of the electrical signals generated by the set of microphones, receive a combined signal including a combination of the timing signal and a corresponding unsynchronized electrical signal from each of the microphones, separate each of the combined signals to recover the unsynchronized electrical signal and the timing signal, align the unsynchronized electrical signals according to the recovered timing signal to produce synchronized electrical signals, process the electrical signal to enable detection of an event during a chemical mechanical polishing operation, and in response to detecting the event, transmit a feedback signal corresponding to the detected event to the process controller,
wherein the process controller is further configured to receive the feedback signal and initiate a change in one or more parameters of the process based on the received feedback signal, calculate a distance of a source of the sound from each microphone of the set of microphones, and calculate a location of the source of the sound.

15. The apparatus of claim 14, wherein the signal processor is further configured to recognize patterns in the detected sound as corresponding to predetermined events during the operation of the apparatus and match the patterns of sounds with known events based on event models or using previously learned correspondence between patterns of sounds and events.

16. The apparatus of claim 14, wherein the one or more parameters of the process comprise at least one selected from the group consisting of a rotational velocity of the rotatable platen, a flow rate and composition of a slurry being supplied on a polishing pad disposed on the rotatable platen, and a pressure at which a wafer contacts the polishing pad.

17. The apparatus of claim 14, wherein the set of microphones is configured to detect sounds with a frequency in a range of about 0.01 Hz to about 200 MHz.

18. The apparatus of claim 17, wherein the at least one infrasonic microphone is designed to detect sounds of frequencies from about 0.01 Hz to about 20 Hz, the at least one acoustic microphone is designed to detect sounds of frequencies from about 20 Hz to about 20 kHz, and the at least one ultrasonic microphone is designed to detect sounds from about 20 kHz to about 200 MHz.

19. The apparatus of claim 14, wherein the signal processor is further configured to perform at least one selected from the group consisting of filtering the electrical signal to remove noise or ambient sound from the detected sound, detecting a position of a source of the detected sound, processing the electrical signal in time domain or in frequency domain.

20. The apparatus of claim 14, wherein the detected event is at least one selected from the group consisting of an end point of the chemical mechanical polishing operation, a scratch on a wafer surface, degradation of a polishing pad, abnormal leveling of the polishing pad or the wafer, presence of an abrasive particle on the polishing pad or the wafer surface, and change in material at the wafer surface.

* * * * *